United States Patent [19]
Witcraft et al.

[11] Patent Number: 5,820,924
[45] Date of Patent: Oct. 13, 1998

[54] METHOD OF FABRICATING A MAGNETORESISTIVE SENSOR

[75] Inventors: William F. Witcraft, Minneapolis; Tangshiun Yeh, St. Paul; Cheisan J. Yue, Roseville; Michael J. Bohlinger, Minnetonka, all of Minn.

[73] Assignee: Honeywell Inc., Minneapolis, Minn.

[21] Appl. No.: 869,607

[22] Filed: Jun. 6, 1997

Related U.S. Application Data

[63] Continuation of Ser. No. 648,788, May 16, 1996, abandoned.

[51] Int. Cl.⁶ .................................................... B05D 5/12
[52] U.S. Cl. ......................... 427/130; 427/131; 427/256; 427/372.2
[58] Field of Search .................................. 427/128–132, 427/372.2, 256

[56] References Cited

U.S. PATENT DOCUMENTS

| | | | |
|---|---|---|---|
| 5,247,278 | 9/1993 | Pant et al. | 338/32 R |
| 5,380,548 | 1/1995 | Lin et al. | 427/130 |
| 5,492,720 | 2/1996 | Gill et al. | 427/131 |
| 5,503,870 | 4/1996 | Fontana, Jr. et al. | 427/130 |

OTHER PUBLICATIONS

Effect of Magnetic Anisotropy on Signal and Noise of NiFe Magnetoresistive Sensor, by T. Yeh and W.F. Witcraft, IEEE Transactions on Magnetics, vol. 31, No. 6, Nov. 1995.

*Primary Examiner*—Bernard Pianalto
*Attorney, Agent, or Firm*—Gregory A. Bruns

[57] ABSTRACT

A method for manufacturing magnetoresistive sensors whereby a first determination of an anisotropy field of the magnetoresistive material is made and an annealing temperature is selected based on a desired final value of the anisotropy field.

15 Claims, 4 Drawing Sheets

METHOD OF FABRICATING A MAGNETORESISTIVE SENSOR

This application is a continuation of application Ser. No. 08/648,788, filed May 16, 1996, abandoned.

BACKGROUND OF THE INVENTION

The present invention relates generally to magnetic field sensors and specifically to magnetoresistive sensors and a method of making the same. Magnetoresistive sensors typically use permalloy, a ferromagnetic alloy containing nickel (Ni) and iron (Fe), as the magnetoresistive material. Permalloy of approximately 81% nickel and approximately 19% iron is typically used.

Magnetoresistive sensors are used in solid state compassing applications. These include, for example, automotive, marine, industrial, aircraft and space applications. Signature detection systems make use of magnetoresistive sensors for traffic and vehicle control, mine detection and weapon fuzing systems, and metal detection such as mining, separation and security. In addition, magnetoresistive sensors are used for anomaly detection such as proximity detection and position detection, whether angular or linear.

Among the most important characteristics of a magnetic field sensor are sensitivity and range or linearity. A sensitive film being one whose magnetization rotates by a large amount when a magnetic field is applied to the film, i.e., small changes in field strength will cause large changes in the resistance of the films. Sensitivity may be varied by varying the proportions of materials used in the permalloy strips, e.g., by increasing the content of cobalt. Sensitivity is also affected by the physical dimension relationships of the permalloy strip.

The designer of magnetoresistive sensors typically makes use of modeling equations which consider the width and thickness of the magnetic strip, as well as the anisotropy field Hk of the magnetic material and other factors.

Using the typical modeling techniques of the past results in a very useful sensor but one in which there can still be a significant variation in sensitivity from the intended or design sensitivity. This uncertainty or variation in sensitivity causes problems which include making the design of the electronics which interface with the sensing element or transducer more difficult.

In the past, a manufacturer of magnetic sensors could only change the sensitivity by using a material having a different characteristic or changing the design of the sensor, that is, changing the area or thickness of the NiFe material. Thus, a need exists for a simple method of changing the output signal or sensitivity of a magnetic sensor without changing the design of the sensor.

SUMMARY

The present invention solves these and other needs by providing a method of
 fabricating a magnetic field sensor including the steps of providing a silicon substrate;
 forming an insulating layer on the substrate generating a first magnetic field as a new line 12;
 forming a layer in the presence of said first magnetic field of magnetoresistive material on the insulating layer;
 determining a first value of the anisotropy field; and
 annealing at a temperature selected to provide a desired anisotropy field.

DETAILED DESCRIPTION OF THE INVENTION

Figure 1:
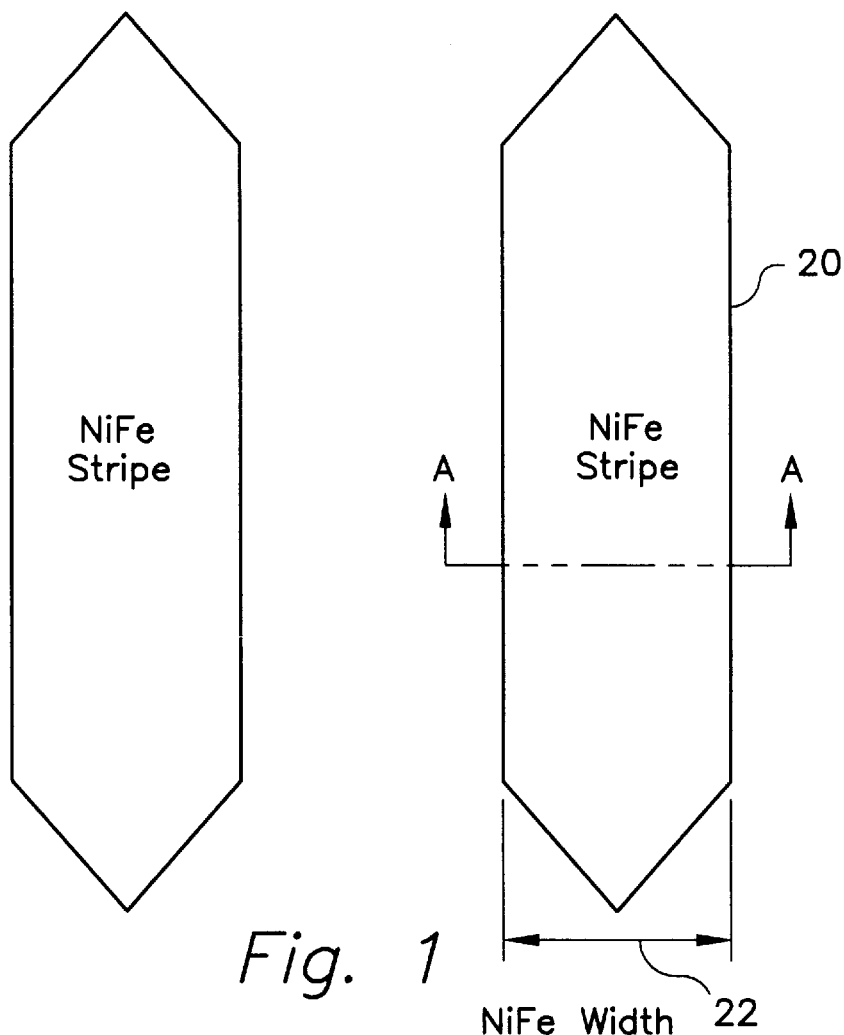
FIG. 1 is a top plan view of a magnetoresistive strip as used in a magnetic sensing device.
Figure 2:
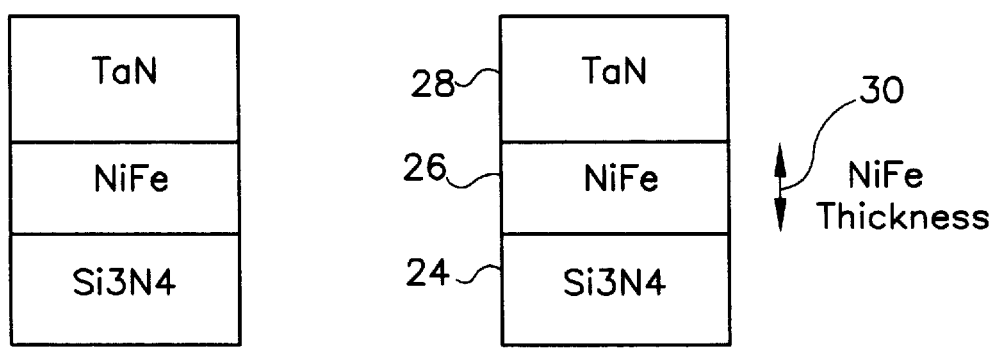
FIG. 2 is a sectional view of the magnetoresistive strip of FIG. 1 along section line a—a.

FIG. 1 shows a top view of a single magnetoresistive stripe or strip 20 that has a width 22. FIG. 2 shows a sectional view of strip 20 including $Si_3N_4$ layer 24, NiFe layer 26 and TaN layer 28. NiFe layer 26 has a thickness 30. Width 22 and thickness 30 are typically used in the modeling of magnetoresistive magnetic field sensors.

In a device for sensing magnetic fields, magnetoresistive elements are typically connected in a bridge arrangement. Each of the elements typically consists of an array of parallel magnetoresistive stripes such as 20 which are connected in series with one another. Certain details of the construction of magnetoresistive sensors are contained in U.S. Pat. No. 5,247,278 dated Sep. 21, 1993 and in U.S. Pat. No. 4,847,584 dated Jul. 11, 1989 and assigned to the same assignee as the present application which are hereby incorporated by reference.

Figure 3:
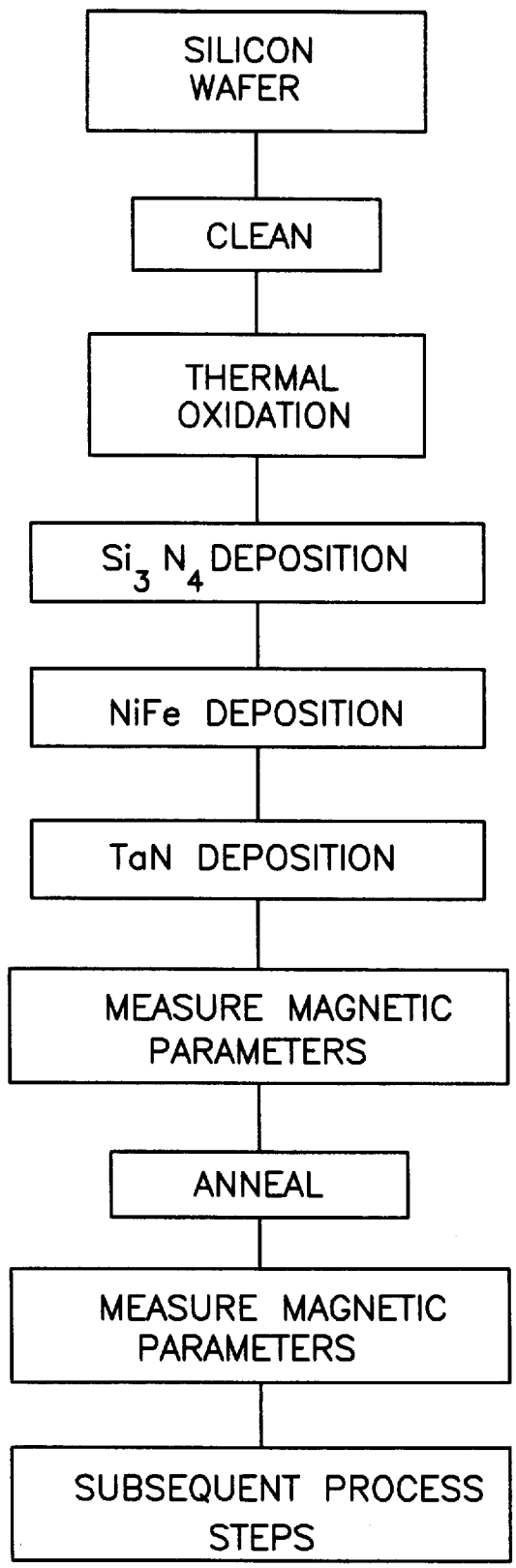
FIG. 3 is a flow diagram of the steps of a method according to the principles of the present invention.

The method of the present invention when the annealing step is performed before patterning the magnetoresistive material is illustrated in FIG. 3 and includes the following steps:
 a silicon wafer is cleaned according to a known process;
 a thermal oxidation process is used to grow a thermal oxide layer of, for example, approximately 4,000 angstroms;
 silicon nitride is deposited to a thickness of, for example, approximately 300 angstroms;
 nickel iron is deposited to a thickness of, for example, approximately 175 angstroms in the presence of a magnetic field in a given direction;
 tantalum nitride is deposited to a thickness of, for example, approximately 600 angstroms.

At this time the wafer has a bulk layer of the magnetoresistive material having an easy axis in a known direction. A BH looper is then used to determine the magnetic parameter of anisotropy field Hk. With the Hk of the material determined, the appropriate annealing temperature may be determined considering the particular sensor design layout, the desired sensitivity, and information similar to that found in FIGS. 4 through 6. The wafer is then annealed at the desired temperature for a time of approximately 1 hour.

A BH looper may then be used again to determine a post-anneal Hk value to assure that the desired Hk of the magnetoresistive material has been achieved. Subsequent processing steps which depend on the specific sensor are then performed.

Table 1 shows experimental results obtained from 12 separate wafers. The magnetic material deposition was performed in a 4-wafer batch processing system and the relatively large variations in the pre-Hk values in a few cases are believed to be due to variations due to the deposition system and the particular wafer position during deposition. The post-Hk values show the measured Bk after annealing. The Delta Bk values are the difference between the pre-Hk and post-Hk values.

The SENS (MV) is the sensitivity determined from electrical tests at the wafer level of individual magnetoresistive sensors of a particular design. Table 1 expresses these sensitivity values in units of millivolts per volt per oersted (mv/v/Oe).

TABLE 1

| Anneal Temp. | Pre Hk | Post Hk | Delta Hk | Sensitivity (Mv/V/Oe) | NiFe Thick (Å) | NiFe Linewidth ($\mu$) |
|---|---|---|---|---|---|---|
| 300 | 3.50 | 3.34 | 0.16 | 2.83 | 175 | 30 |
| 300 | 5.46 | 4.82 | 0.64 | 2.37 | 175 | 30 |
| 325 | 5.80 | 4.79 | 1.01 | 2.38 | 175 | 30 |
| 325 | 5.27 | 4.26 | 1.01 | 2.69 | 175 | 30 |
| 350 | 5.64 | 4.37 | 1.27 | 2.58 | 175 | 30 |
| 350 | 5.64 | 4.40 | 1.25 | 2.60 | 175 | 30 |
| 375 | 4.53 | 3.05 | 1.48 | 3.31 | 175 | 30 |
| 375 | 5.75 | 3.10 | 2.65 | 3.12 | 175 | 30 |
| 400 | 5.83 | 2.75 | 3.07 | 3.53 | 175 | 30 |
| 400 | 5.43 | 2.09 | 3.34 | 3.78 | 175 | 30 |
| 425 | 5.96 | 2.17 | 3.79 | 3.81 | 175 | 30 |
| 425 | 5.80 | 2.36 | 3.44 | 3.76 | 175 | 30 |

Figure 4:
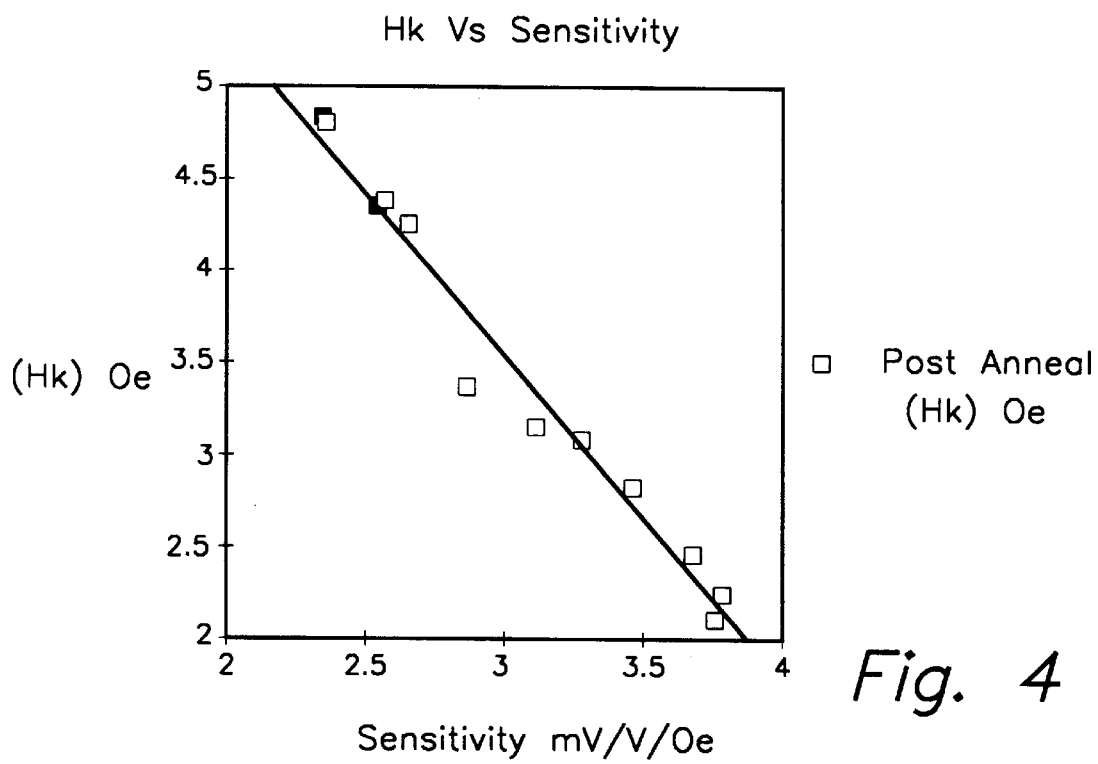
FIG. 4 is a graph of the sensitivity of a particular sensor design as a function of the post-anneal anisotropy field.

FIG. 4 shows the Hk, i.e., the amount of energy required to rotate the magnetic field from the easy axis to the hard axis for 175 Angstroms thick NiFe film (post anneal), vs. an output sensitivity for a NiFe bridge sensor. The sensor configuration includes four legs, contains six NiFe strips 30 microns wide by 840 microns long (24 squares of NiFe strip).

Figure 5:
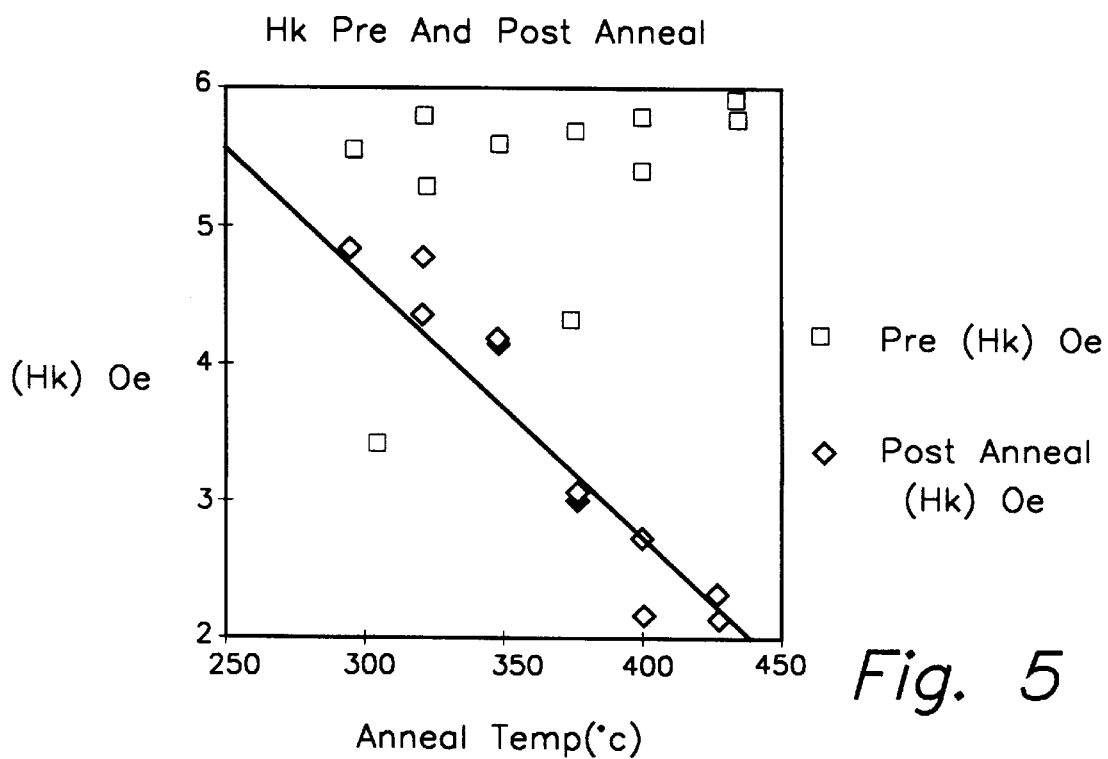
FIG. 5 is a graph of the change in the anisotropy from pre-anneal to post-anneal as a function of the anneal temperature.

FIG. 5 shows the Hk as sputter deposited, and post anneal. The NiFe film thickness is 175 Angstroms with no pattern defined.

Figure 6:
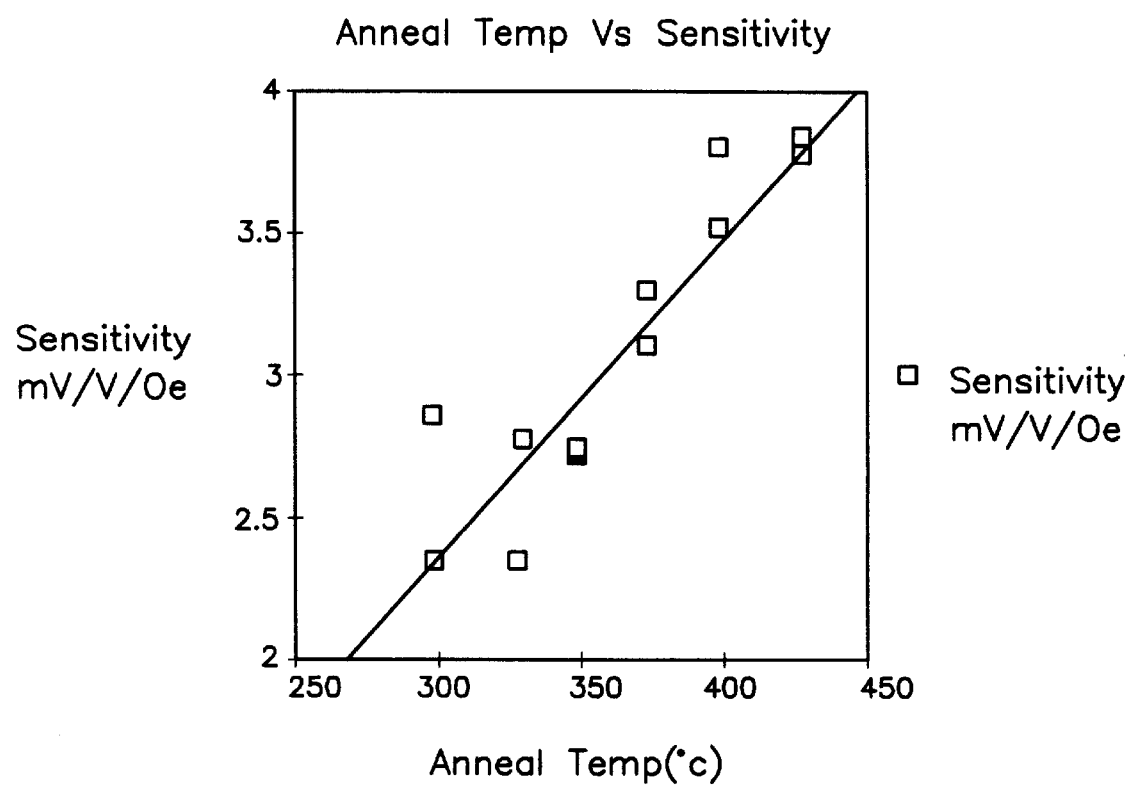
FIG. 6 is a graph of the sensitivity as a function of the annealing temperature for the sensor of FIG. 4.

FIG. 6 shows the correlation of annealing temperature on the output sensitivity of the NiFe sensor of FIG. 4. The anneal was performed in a forming gas ambient with an applied magnetic field parallel to the easy axis of the NiFe films.

An alternative to the previously described method is to perform the annealing step at a different time in the process sequence. For example, the annealing process could be performed after the bulk NiFe layer has been patterned to form the sensor elements.

A second alternative is to perform the annealing process after the sensor has been patterned and packaged with any associated electronics.

For purposes of illustration, the method of the present invention has been described relative to a sensor having magnetoresistive stripes 20. However, the present invention applies as well to herringbone or other sensor designs. The method of the present invention was also described in terms of using a silicon wafer as a substrate. Other substrates, for example, glass or ceramic, could also be used in place of silicon. The method of the present invention applies to a sensor device which includes only the magnetic sensing elements, i.e., the transducer as well as to a sensing device that is integrated with the associated electronics on a single semiconductor die. Thus Applicant's have invented a simple method which can easily be incorporated into a process for manufacturing magnetic field sensors of magnetoresistive material.

In using the method of the present invention, consideration is to be given to the effect of certain processes, e.g., plasma etching on the sensor or associated electronics.

The invention is to be indicated by the appended claims rather than by the foregoing description.

We claim:

1. A method of fabricating a magnetic field sensor using magnetoresistive material comprising the steps of:

providing a substrate;

forming an insulative layer on said substrate;

generating a first magnetic field;

forming a layer of a magnetoresistive material on said insulative layer in the presence of said first magnetic field;

determining a first value of an anisotropy field of said magnetoresistive material;

generating a second magnetic field;

annealing at a first temperature, for a period greater than several minutes, in the presence of said second magnetic field, said first temperature selected to provide a second value of said anisotropy field, said second value being lower than said first value;

said second value related to a desired sensitivity of said magnetic field sensor;

patterning said magnetoresistive material to form a magnetic field transducer; and continuing with subsequent processing steps.

2. Method of claim 1 wherein said step of forming an insulative layer includes the steps of:

forming an oxide layer on said substrate by thermal oxidation; and forming a layer of silicon nitride on said oxide layer.

3. Method of claim 2 wherein said magnetoresistive material is a nickel iron alloy.

4. Method of claim 3 wherein said first temperature is between 250° C. and 450° C.

5. Method of claim 4 wherein said subsequent processing steps include a step of patterning said layer of magnetoresistive material and said step of annealing occurs after said step of patterning.

6. Method of claim 1 wherein said subsequent processing steps include a step of patterning said layer of magnetoresistive material and said step of annealing occurs after said step of patterning.

7. A method of fabricating a magnetic field sensor using magnetoresistive material comprising the steps of:

providing a silicon substrate forming an insulative layer on said substrate;

generating a first magnetic field;

forming a layer of a magnetoresistive material on said insulative layer in the presence of said first magnetic field;

determining a first value of an anisotropy field of said magnetoresistive material;

generating a second magnetic field;

annealing at a first temperature, for a period greater than 300 seconds, in the presence of said second magnetic field, said first temperature selected to provide a second value of said anisotropy field;

said second value being lower than said first value and related to a desired sensitivity of said magnetic field sensor;

patterning said magnetoresistive material to form a magnetic field transducer; and continuing with subsequent processing steps.

8. Method of claim 7 wherein said substrate is silicon and said step of forming an insulative layer on said substrate includes the steps of:

forming a thermal oxide layer on said substrate; and forming a silicon nitride layer on said thermal oxide layer.

9. Method of claim 8 wherein said magnetoresistive material is a nickel iron alloy.

10. Method of claim 9 wherein said first temperature is between 250° C. and 450° C.

11. Method of claim 8 wherein said subsequent processing steps include a step of patterning said layer of magnetoresistive material and said step of annealing occurs after said step of patterning.

12. In a method of manufacturing a magnetic field sensor comprising forming a layer of magnetoresistive material on a silicon wafer in the presence of a first magnetic field, patterning said layer of magnetoresistive material to form magnetic field transducers and annealing said transducers, the improvement comprising the steps of:

determining a first value of an anisotropy field of said magnetoresistive material;

generating a second magnetic field;

annealing said wafer at a first temperature for a period greater than several minutes in the presence of said second magnetic field, said first temperature selected to provide a second value of said anisotropy field with said second value of said anisotropy field related to a desired sensitivity of said transducers;

patterning said magnetoresistive material to form magnetic field transducers; and continuing with subsequent processing steps.

13. Method of claim 12 wherein said magnetoresistive material is a nickel iron alloy.

14. Method of claim 13 wherein said first temperature is between 250° C. and 450° C.

15. Method of claim 12 wherein said step of annealing at a first temperature occurs after said step of patterning said magnetoresistive material.

* * * * *